United States Patent [19] [11] 4,187,124
Muller et al. [45] Feb. 5, 1980

[54] PROCESS FOR DOPING SEMICONDUCTORS

[75] Inventors: Jean-Claude Muller; Jean-Pierre Ponpon; Joseph Kurek; Paul Siffert, all of Strasbourg, France

[73] Assignee: Agence Nationale de Valorisation de la Recherche (ANVAR), Neuilly-sur-Seine, France

[21] Appl. No.: 887,076

[22] Filed: Mar. 15, 1978

[30] Foreign Application Priority Data

Mar. 18, 1977 [FR] France ................................ 77 08138

[51] Int. Cl.² ...................... H01L 21/263; H01J 37/30
[52] U.S. Cl. ................................ 148/1.5; 204/192 N; 250/492 A; 357/91
[58] Field of Search ........................ 204/192 S, 192 N; 148/1.5; 357/91; 250/492

[56] References Cited

U.S. PATENT DOCUMENTS

| 3,520,741 | 7/1970 | Mankariosus | 148/175 |
| 3,583,361 | 6/1971 | Laudel, Jr. | 118/49.5 |
| 3,908,183 | 9/1975 | Ennis, Jr. | 357/65 |
| 3,999,072 | 12/1976 | Takagi | 250/427 |
| 4,013,891 | 3/1977 | Ko et al. | 250/492 A |
| 4,021,675 | 5/1977 | Shifrin | 250/492 A |
| 4,035,655 | 7/1977 | Guernet et al. | 250/492 A |
| 4,074,139 | 2/1978 | Pankove | 250/492 A |
| 4,082,636 | 4/1978 | Takagi | 204/192 N |

Primary Examiner—L. Dewayne Rutledge
Assistant Examiner—Upendra Roy
Attorney, Agent, or Firm—Daniel M. Rosen

[57] ABSTRACT

A process and apparatus for doping a substrate by ion implantation or discharge. The process comprises the steps of maintaining an electric discharge in an evacuated enclosure containing a gaseous compound of a dopant for creating ions of said dopant; extracting and accelerating a beam of said ions from said atmosphere toward said substrate under a voltage selected for achieving a predetermined doping profile; and circulating said substrate transversely to said beam.

12 Claims, 1 Drawing Figure

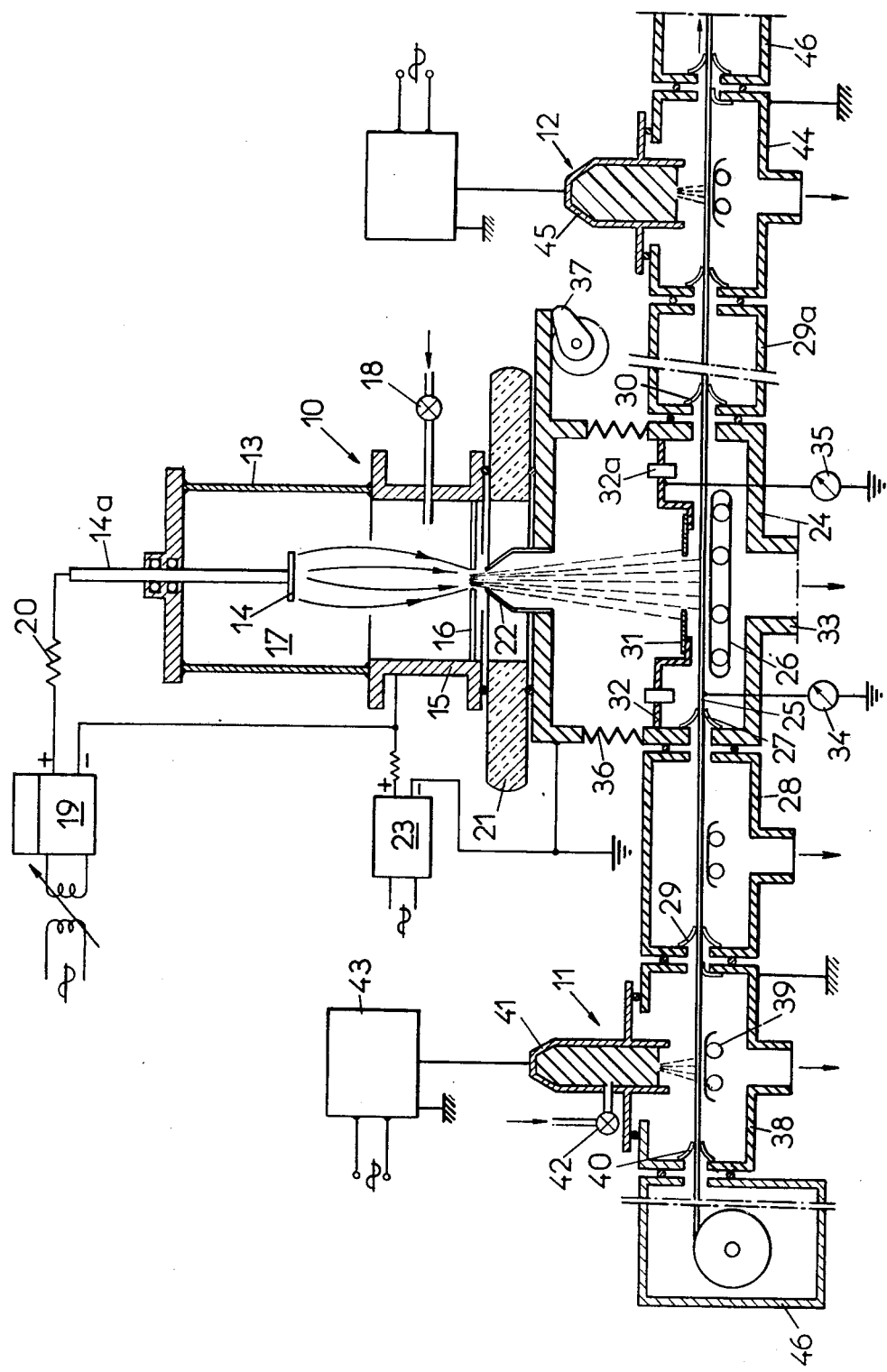

PROCESS FOR DOPING SEMICONDUCTORS

BACKGROUND AND SUMMARY OF THE INVENTION

The present invention relates to doping of a substrate, particularly of semiconductor material, and has for an object to provide a doping method and apparatus which make it possible to achieve high concentrations of doping impurities over a small, but well determined, thickness, from the surface of such substrate.

Numerous semiconductor devices are prepared by doping a substrate with acceptor or donor impurities at a concentration close to the solubility limit, over a very small superficial thickness but in a precisely defined concentration. Examples of such devices are certain types of integrated circuits, some types of nuclear radiation detectors and photovoltaic cells, in which the surface conductivity must be as high as possible to reduce the conversion yield losses. Conventional surface doping techniques by thermal diffusion or ionic implantation having shortcomings when attempts are made to attain this result, in particular for producing photovoltaic solar cells. The first above-named technique is not applicable to polycrystalline substrates for the available impurities concentrate at grain boundaries. Direct ionic implantation leads to high costs for the equipment is complex and the ionic currents obtained have in general too low a density for processing large surfaces in acceptable periods of time.

It is an object of the present invention to provide an improved doping process, particularly for producing PN junctions and ohmic or rectifying contacts, by ionic bombardment of a semiconductor substrate, allowing high and homogenous concentrations to be obtained in an economical way.

According to a first aspect of the invention, there is provided a process for doping a semiconductor substrate comprising the steps of maintaining an electric discharge in an atmosphere containing a gaseous compound of a dopant for creating ions of said dopants; extracting and accelerating a beam of said ions from said atmosphere towards said substrate under a voltage selected for achieving a predetermined doping profile; and circulating said substrate transversely to said beam. It should be noted that this process, while related to conventional processes of ionic implantation in so far as the doping process properly speaking is concerned, is fundamentally different therefrom as regards the method of creating the ion beam which is accelerated towards the substrate: the ion currents which can be obtained are greater by several orders of magnitude than those possible with conventional ionic implantation.

Either one surface of the substrate, or both, can be treated, depending on the ultimate use of the processed article.

Among the applications of the process, there can be mentioned particularly the manufacture of photovoltaic cells by implantation of ions on a silicon substrate which will typically be polycrystalline, while however other forms of silicon may be used. The substrate can be in the form of a ribbon, which allows a particularly economical use thereof, or successive thin boards or plates.

In accordance with another aspect of the invention, there is provided an apparatus for doping a semiconductor substrate by ion implantation, comprising: a discharge chamber; means for maintaining an atmosphere containing a gaseous compound of a dopant in said chamber under sub-atmospheric pressure; at least a pair of electrodes one of which is formed with at least one ion extraction opening and separates said discharge chamber from an implantation chamber arranged for receiving the substrate; electric supply means for establishing an electric discharge in said chamber between said electrodes; ion accelerating electrode means located in proximity to the extraction electrode, between the extraction electrode and the substrate; and means for applying an acceleration voltage to the accelerating electrode means.

In a particular embodiment, the chamber which receives the substrate, and which forms an implantation chamber, is provided with means for introducing the substrate, for circulating it along a path across the ion beam and for extracting it therefrom. This chamber is provided with means for maintaining therein a vacuum which is generally between $10^{-2}$ and $10^{-4}$ mm of mercury. The ionic current densities will be in general between about 0.1 mA/cm$^2$ and 1 mA/cm$^2$, at least when a single extraction orifice is formed. It is however possible to use an output electrode formed with a plurality of extraction openings and then the overall current density can be increased. It is also possible to provide a plurality of discharge chambers each delivering a ion beam to the implantation chamber.

The discharge and acceleration voltages will generally respectively be a few kV and a few tens of kV.

The parts which constitute an ion source can be formed as a unit which is simple and low weight. That unit can be movably connected to the implantation chamber and provided with a scanning mechanism, thereby permitting to implant ions on large areas.

The technique which is used makes it possible to omit selection magnets and stabilization of the HV electric supply. As a consequence, it is possible either to use a low cost HV supply or to use a modulated HV supply for achieving inhomogeneous doping precisely for specific purposes.

The invention will be better understood from reading the description of a device forming a particular embodiment, for treating a ribbon of polycrystalline silicon.

SHORT DESCRIPTION OF THE DRAWING

The single FIGURE shows the apparatus schematically in cross-section along a vertical plane passing through the axis.

DETAILED DESCRIPTION OF THE PREFERRED EMBODIMENT

Referring to the Figure, the main component of the apparatus is a doping cell 10 which could be used separately. It is however more advantageous, particularly for continuous operation, to associate it with different cells intended for treatments before and/or after the implantation, as shown in the Figure.

The doping cell may be regarded as comprising:
- a discharge tube for forming ions of the impurity (dopant);
- an accelerator for extracting the ions from the tube and giving them sufficient energy over a short distance;
- an implantation chamber. The doping cell is associated with ancillary elements and systems such as electric supply, adjustment and displacement means.

The discharge tube comprises an electrically insulating enclosure comprising a tube 13, made of tempered glass or of quartz for example, and an insulating bottom plate through which passes a rod 14a for positioning a discharge electrode 14, made from a material resisting the bombardment to which it is subjected in use (tungsten, tantalum or molybdenum for example). The lower part of tube 13 is fixed on a sleeve 15 which carries the second discharge electrode 16, through which is provided a hole of a few mm$^2$ so that it forms an output electrode for the ions. A feeder line delivering a gaseous compound of the N or P type impurity to be implanted opens into chamber 17 defined by the enclosure.

In the embodiment shown, the feed is provided by a tube having an adjustable micro-leak valve 18 and projecting into the upper part of sleeve 15. A sub-atmospheric pressure (0.1 to 10 mm of mercury in general) is maintained by pumping, either directly or, as shown in the figure, through electrode 16. The gas fed is generally a halogenide of the doping impurity, such as $BF_3$ or $PCl_5$. A D.C. voltage source 19 maintains a potential difference between electrodes 14 and 16 which creates, at the pressure prevailing in chamber 17, an electrical discharge. The operating conditions may be such that discharge can be of any type between a simple collection of charges (which leads to currents which are too low) and arc conditions (which would cause rapid damage to the apparatus and instability due to the negative resistance characteristics of the arc). It will however in general be desirable to provide glow discharge conditions, which allows high ionic currents to be achieved, typically exceeding 10 mA. A source 19 of a few kV is sufficient to attain this result, the possibility of moving electrode 14 by means of rod 14a avoiding any difficulty in striking. A current limiting resistor 20 is advantageously provided for protecting source 19.

The ion accelerator is fed through electrode 16. It comprises an insulator 21 placed between sleeve 15 and an extraction and acceleration electrode support 22. "O" rings provide sealing. Electrode 22 is conical in shape and finishes in the immediate enighbourhood of electrode 16, at about 10 mm for example. A high voltage source 23, typically of a few tens of kV, provides the acceleration potential between electrodes 16 and 22. The respective size of the holes in these electrodes determines the divergence of the ion beams.

The ions delivered by chamber 17 are accelerated for a short distance and no ancillary element such as a magnet is necessary. However, magnetic or electrostatic lenses may be provided, if focussing is useful.

The implantation chamber is defined by electrode 22 and its support and a box 24 for the running of substrate tape 25.

Referring to the Figure, box 24 is provided so as to allow continuous travel of the substrate across the box, perpendicularly to the ion beam. For that, it comprises a belt and roller conveyor 26. Substrate 25 enters the chamber through a slit fitted with a lip seal 27 which reduces leaks. In the embodiment illustrated, the inlet face of box 24 is sealingly secured to an additional box 28 defining a buffer chamber, in which substrate 25 also enters through a lip seal 29. Similarly, the substrate is moved out of box 24 into an additional buffer chamber 29a through a lip seal 30.

The implantation chamber contains moreover an apertured plate 31 placed in the immediate neighbourhood of the substrate (in general at a distance of a few mm), fixed to chamber 24 through a support 32 and insulating means 32a. An ammeter 35 is provided for measuring the current through the apertured plate.

Box 24 is provided with piping 33 for connection to a vacuum pump which in operation maintains in the implantation chamber a vacuum between $10^{-2}$ and $10^{-4}$ torr. On the other hand, discharge chamber 17 may be deprived of vacuum means since it is connected to the implantation chamber through the hole provided in electrode 22.

The amount of ions received by the substrate may be measured by providing a milliammeter 34 in the earthing circuit of the substrate. The milliammeter 35 may be provided between the diaphragm, or its support 32, and earth.

In the illustrated embodiment, the assembly formed by the discharge chamber and the accelerator is connected to box 24 through bellows 36 which allows for movement of the assembly in relation to box 24. The movement may be achieved by conventional means, such as the one shown very schematically at 37.

The doping apparatus may be used with a single box 24 or, better still, with two lateral boxes 28 and 29 which reduce the leaks from the atmosphere. It is however often necessary to subject the substrate to a pretreatment immediately after implantation and/or to an annealing treatment after implantation. In the embodiment illustrated, all the operations are carried out continuously in the same device.

In particular, it is often necessary to clean the surface of the substrate immediately prior to ionic implantation. The apparatus comprises for this purpose a sputtering block 11 which comprises a box 38 very similar to box 28, provided like the latter with a conveyor 39 and an inlet lip-seal 40. On box 38 is sealingly mounted a ion gun 41 supplied with argon through a micro-leak valve 42 and provided with its own electrical supply 43. Instead of an argon gun, a discharge chamber similar to the one which serves for the implantation could be used.

When the substrate is polycrystalline silicon, surface annealing, at a temperature between 800° C. and 900° C. in general, is necessary to reduce the surface electrical resistance to the very low value which is desirable for a photovoltaic cell.

In the illustrated embodiment, annealing is carried out by an additional block 12 which again comprises a box 44 similar to the others, fitted with an electron gun 45 which irradiates the substrate strip 25. Electron gun 45 may be replaced by a laser with an appropriate wave length or even by an incandescent lamp.

Finally, the apparatus shown comprises again two additional terminal boxes 46 whose role is to limit leaks.

In the embodiment illustrated, each box is provided with piping for connecting to a vacuum pump. It is sometimes possible to dispense with these connections.

The process need not be fully described, since it follows from the description which has been given of the apparatus. Once a suitable vacuum has been created in the apparatus, the gun for supplying argon ions for cleaning and the annealing electron gun are supplied with current. The implantation device properly speaking is brought into service. The conveyors are supplied with current. The discharge is triggered off by bringing electrodes 14 and 16 close together. Then these electrodes are moved away from each other to a suitable distance. The ion flow is metered by adjusting the high voltage source supply 19 and may be monitored by means of the milliammeter 34.

The invention may be used for a number of applications, particularly as follows.

PN junctions may be achieved by implanting donor or acceptor ions in a N or P semiconductor substrate.

Ohmic contacts may also be achieved by implanting a high concentration of N or P dopant in a N or P substrate, respectively. That use may be combined with the previous one and will only involve adding one or more supplemental modules to the apparatus along the path of the substrate.

Last, alloys or chemical combinations may be formed superficially on a metal sheet for improving corrosion resistance or improving mechanical resistance.

An application which appears particularly important consists in the manufacture of photovoltaic solar cells. Dopant impurity(ies) are then superficially implanted, at a concentration close to the limit solubility(ies) of said impurity(ies) on a silicon substrate. The substrate will typically be low cost polycrystalline silicon. However, monocrystalline silicon may obviously be used. In certain cases, the use of amorphous silicon may be envisioned. The substrate will be in the shape of ribbons or plates.

By way of example, P-N junction photovoltaic solar cells have been produced in an atmosphere of $BF_3$ and $PF_5$, with a discharge voltage of 9 kV. The doses were respectively 10 and 7 (milliamps/cm$^2$)×mm. The cells deliver respectively the following specific voltages and currents, under a radiation of 100 mW/cm$^2$:

| cell doped in $BF_3$ atmosphere: | $V_{oc}$ = 500 at 530 mV; $I_{sc}$ = 32 at 35 mA/cm$^2$ |
|---|---|
| cell doped in $PF_5$ atmosphere: | $V_{oc}$ = 500 at 510 mV; $I_{sc}$ = 28 at 29 mA/cm$^2$ |

The invention is not limited to the particular embodiment which has been shown and described by way of example and it must be understood that the scope of the present patent extends to any equivalent process or apparatus. As an example, several successive processing steps (cleaning, implantation and annealing) may be carried out in a same vacuum enclosure.

We claim:

1. A process for doping a semiconductor substrate by ion implantation comprising the steps of striking an electric discharge in an atmosphere containing a gaseous compound of a dopant under a pressure between 0.1 and 10 mm of mercury for creating ions of said dopant; extracting and accelerating a beam of said ions from said atmosphere toward said substrate under a voltage selected for achieving a predetermined doping profile; and circulating said substrate transversely to said beam.

2. A process according to claim 1, wherein the ions are created by discharge in an atmosphere consisting of a halogenated compound of the dopant.

3. A process according to claim 1, wherein a gaseous compound of a N or P dopant is used for providing a Pn junction on a substrate of semiconductor material of N or P type, respectively.

4. A process according to claim 1, wherein a ohmic contact is achieved on a semiconductor substrate by implantation of a high concentration of dopant.

5. A process according to claim 1 for manufacturing photovoltaic solar cells on a ribbon or plate of silicon, the concentration of ions being close to the solubility limit.

6. A process according to claim 2, wherein an ion current is created directed towards the substrate which has an intensity between 0.1 mA/cm$^2$ and 1 mA/cm$^2$.

7. A process for doping a semiconductor substrate by ion implantation, comprising the steps of: striking an electrical discharge in an atmosphere containing a halogeneous compound of a dopant under sub-atmospheric pressure; extracting a beam of dopant ions from said atmosphere through an ion extraction opening into an implantation chamber; accelerating said ions over a short distance from said opening by an electric field; and circulating said substrate transversely to the ion beam at a distance from said opening much higher than the distance over which said ions are accelerated.

8. A process according to claim 7, wherein the acceleration field is of several tens of kV per centimeter.

9. A process according to claim 7, wherein the implantation chamber is maintained under a pressure of between $10^{-2}$ and $10^{-4}$ mm of mercury.

10. A process according to claim 9, wherein the substrate is in ribbon form and is continuously introduced from atmosphere into said chamber and extracted from said chamber after it has been processed.

11. A process according to claim 9, further comprising the step of annealing said substrate by an electron or photon beam or by electrical heating immediately after it is extracted from said chamber and while it is circulated out of the implantation chamber.

12. A process according to claim 10, further comprising the steps of superficially cleaning said substrate by cathode or discharge sputtering in a partial vacuum while it is circulated into said implantation chamber.

* * * * *